US010170182B2

(12) United States Patent
Sakhare

(10) Patent No.: US 10,170,182 B2
(45) Date of Patent: Jan. 1, 2019

(54) RESISTANCE CHANGE MEMORY DEVICE CONFIGURED FOR STATE EVALUATION BASED ON REFERENCE CELLS

(71) Applicant: IMEC VZW, Leuven (BE)

(72) Inventor: Sushil Sakhare, Heverlee (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 15/458,874

(22) Filed: Mar. 14, 2017

(65) Prior Publication Data
US 2017/0271002 A1    Sep. 21, 2017

(30) Foreign Application Priority Data

Mar. 16, 2016   (EP) ..................................... 16160785

(51) Int. Cl.
    *G11C 11/00*   (2006.01)
    *G11C 13/00*   (2006.01)
    (Continued)

(52) U.S. Cl.
    CPC ........ *G11C 13/004* (2013.01); *G11C 11/1673* (2013.01); *G11C 13/0097* (2013.01); *G11C 13/04* (2013.01); *G11C 2013/0054* (2013.01)

(58) Field of Classification Search
    CPC .............. G11C 13/004; G11C 13/0097; G11C 11/1673; G11C 13/04
    (Continued)

(56) References Cited

U.S. PATENT DOCUMENTS

| 5,828,615 A | * | 10/1998 | Mukunoki | ............. | G11C 5/147 365/145 |
| 6,600,690 B1 | * | 7/2003 | Nahas | .................... | G11C 7/067 365/158 |

(Continued)

*Primary Examiner* — Viet Q Nguyen
(74) *Attorney, Agent, or Firm* — Knobbe, Martens, Olson & Bear LLP

(57) ABSTRACT

The disclosed technology generally relates to memory devices and more particularly to memory devices based on resistance change, and to systems and methods for evaluating states of memory cells of the memory devices. In one aspect, a memory device includes a plurality of memory cells arranged in an array, where each memory cell comprises a memory element configured to be switched between at least two resistance states. The memory device additionally includes a plurality of word lines and a plurality of bit lines crossing each other, where each of the memory cells is formed at a crossing between one of the word lines and one of the bit lines. In the memory device, the memory cells are configured to be connected to a source line. Additionally, each bit line has a bit line capacitance and is configured to store a charge associated with a state of a selected memory element. Additionally, at least two memory cells electrically connected between one of the word lines and at least two different bit lines are configured as reference cells, where one of the reference cells is in a high resistance state and the other of the reference cells is in a low resistance state. Furthermore, the at least two different bit lines electrically connected to the reference cells are interconnected by an equalizing switch configured to equalize charges associated with bit line capacitances of the at least two bit lines.

19 Claims, 11 Drawing Sheets

(51) Int. Cl.
*G11C 11/16* (2006.01)
*G11C 13/04* (2006.01)

(58) Field of Classification Search
USPC .............................................. 365/148, 210.1
See application file for complete search history.

(56) References Cited

U.S. PATENT DOCUMENTS

| | | | | |
|---|---|---|---|---|
| 6,965,531 | B2 * | 11/2005 | Mine | G11C 7/14 |
| | | | | 365/149 |
| 7,342,819 | B2 * | 3/2008 | Liaw | G11C 7/12 |
| | | | | 365/148 |
| 8,559,253 | B2 | 10/2013 | Kitagawa et al. | |
| 8,570,812 | B2 * | 10/2013 | Madan | G11C 7/02 |
| | | | | 365/185.18 |
| 2002/0080644 | A1 * | 6/2002 | Ito | G11C 11/16 |
| | | | | 365/158 |
| 2006/0067149 | A1 | 3/2006 | Shimizu et al. | |
| 2007/0140029 | A1 | 6/2007 | Kim et al. | |
| 2007/0285974 | A1 * | 12/2007 | Takemura | G11C 8/08 |
| | | | | 365/158 |
| 2010/0195415 | A1 * | 8/2010 | Seko | G11O 5/145 |
| | | | | 365/189.09 |
| 2011/0080773 | A1 * | 4/2011 | El Baraji | G11C 7/067 |
| | | | | 365/158 |
| 2013/0058172 | A1 | 3/2013 | Rao et al. | |
| 2014/0269031 | A1 | 9/2014 | Jung et al. | |
| 2014/0293685 | A1 * | 10/2014 | Noguchi | G11C 11/1675 |
| | | | | 365/158 |
| 2016/0379710 | A1 * | 12/2016 | Sekar | G11C 13/004 |
| | | | | 365/148 |

\* cited by examiner

RESISTANCE CHANGE MEMORY DEVICE CONFIGURED FOR STATE EVALUATION BASED ON REFERENCE CELLS

CROSS-REFERENCE TO RELATED APPLICATIONS

This application claims foreign priority to European Patent Application No. EP 16160785.8, filed Mar. 16, 2016, the content of which is incorporated by reference herein in its entirety.

BACKGROUND

Field

The disclosed technology generally relates to memory devices and more particularly to memory devices based on resistance change, and to systems and methods for evaluating states of memory elements of the memory devices.

Description of the Related Technology

Some memory devices store data in the form of resistance states in memory elements. For example, in resistive random access memory (RRAM) devices or spin transfer torque magnetic random access memory (STT-MRAM) devices, data is stored in memory elements by placing the memory elements in one of a plurality of resistance states, e.g., a high resistance ($R_H$) state or a low resistance ($R_L$) state. In some RRAM and/or STT-MRAM devices, a reference voltage, whose value may be between voltages corresponding to the $R_H$ and $R_L$ states, e.g., a center value between the voltages corresponding to the $R_H$ and $R_L$ states, may be used to evaluate the state of a memory element. However, such reference voltages may be difficult to generate and/or may be generated by circuitry having a relatively large area footprint. For example, some memory technologies employ complex analog blocks to generate a reference voltage/current for sensing the state of a memory element where resistance states are stored as memory states. A disadvantage of circuitry such as complex analog blocks is that they may occupy a relatively large footprint of the semiconductor chip having the memory device, and/or use an undesirably high amount of power.

Furthermore, in such memory devices, an effective yield may be improved by providing redundancy to compensate for defective memory elements. More particularly, redundant memory elements can be provided to remedy one or more memory elements that may be defective, e.g. where the memory elements are stuck at a logical state of 1 or 0.

Consequently, there is room for an improved memory arrangement and corresponding memory readout methods.

SUMMARY OF CERTAIN INVENTIVE ASPECTS

It is an object of embodiments of the present invention to provide accurate sensing in memories based resistance change memories, such as for example STT-MRAM and RRAM.

It is an advantage of embodiments of the disclosed technology that at least one of the above mentioned disadvantages can be solved.

The above objective is accomplished by a method and device according to the disclosed technology.

The disclosed technology relates to a memory arrangement comprising a plurality of memory cells arranged in an array structure, wherein each memory cell comprises a memory element being a two state resistance change memory element.

The memory arrangement comprises crossing word and bit lines, where each memory cell is connected between a different crossing of a word line and a bit line, where the memory cells furthermore being connectable to a source line.

Each bit line has a bit line capacitance, for storing a charge representative of the state of a selected memory element.

A set of at least two memory cells, positioned at different bit lines but on the same word line, are being defined as reference cells, one reference cell being set in a high resistance state and a second reference cell being in a low resistance state.

At least those bit lines wherein the reference cells are defined furthermore are interconnected by an equalizing switch, for equalizing the charges on the bit line capacitance of said at least two bit lines.

It is an advantage of embodiments of the disclosed technology that an average reference of a memory block is created instead of a reference based on two cells. The latter provides a more reliable reference signal.

It is an advantage of embodiments of the disclosed technology that the charge/bit-line is sensed against the average charge/bit-line, since averaging drastically reduces the spread of the reference generated. For a higher number of bits/word, this improves the reliability of the reference.

It is an advantage of embodiments of the disclosed technology that low power operation can be obtained, while having high area efficiency.

The charge representative of the state of a selected memory element may be defined when current is running through the selected memory element. The latter may be when current is flowing between the bit line and the ground, e.g. leading to a discharge of the capacitance. Alternatively, the latter may be when current is flowing between the bit line and a voltage source, which may result in a charging or a discharging of the capacitance.

The bit line capacitance may be a capacitance may be created by the memory element and the wiring of the bit line itself. In some embodiments also an explicit bit cell capacitor may be present.

The number of cells may be two or higher. In some embodiments, the number of reference cells used typically may be an even number, so that the average typically equals the midpoint between a high and a low resistance state. Nevertheless, weighing factors could be introduced so that, when using an odd number of reference cells, the midpoint of all reference cells also results in the midpoint between a high and a low resistance state.

The memory arrangement furthermore may comprise a sense amplifier for reading the state of a selected memory element, different from the cells defined as reference cells, said sense amplifier being configured for using the equalized charge on the bit line capacitors as a reference signal and further configured for using the charge of the selected memory element for reading the state. The sensing amplifier is thus configured for reading the state of the selected memory element. The bit lines whereon the memory elements are positioned are connectable to the sense amplifier inputs and thus can be connected for sensing the charge for the selected memory element. Combined with the equalized charge from the reference cells, the sensing amplifier provides an output representative of the state of the selected memory element.

It is an advantage of embodiments of the disclosed technology that at-pitch sensing is made possible using a plurality of transistor sense-amplifiers, e.g., four sense amplifiers. Since such amplifiers are ultra small, the latter results advantageously in area optimization.

It is an advantage of embodiments of the disclosed technology that there can be a reduction in operating voltage due to the removal of constant biasing during the read operation.

It is an advantage of embodiments of the disclosed technology that systems according to embodiments of the disclosed technology are compatible with existing dynamic random access memory (DRAM) architectures. It is to be noticed that all DRAM modes can be realized using systems according to embodiments of the disclosed technology.

The equalizing switch may comprise a field effect transistor (FET). The FET may be a p-channel or an n-channel metal-oxide-semiconductor field effect transistor (MOSFET), or a pass gate transistor using a p-channel or an n-channel (P and N MOST). Advantageously, the switch should not leak the equalized charge during the read cycle.

The memory elements may be STT-MRAM memory elements or RRAM memory elements.

It is an advantage of embodiments of the disclosed technology that existing DRAM designs can be reused as well as that communication protocols like DDR3-5 can be used.

The memory elements may be connected to the bit line using a selection switch for selectively contacting the memory elements with the supply line during a pre-charge phase thereof.

It is an advantage of embodiments of the disclosed technology that the reference cells as well as the cells to be read can be connected between the supply and the ground by a switch only during the pre-charge phase, rather than being continuously connected. The latter advantageously results in the possibility of having a low power operation.

It is to be noticed that different embodiments can be provided whereby the role of supply and the ground can be switched. In some embodiments, the charge may be created when the current flows from the source line to the bit line through the memory element.

It thus is an advantage of embodiments of the disclosed technology that, when the memory cells are not active, the cells can be disconnected so that no current flows and power is saved. Since advantageously current only flows through the memory cells during the pre-charge phase, full swing VDD dynamic signal range can be obtained. The current thus may only flow during one phase of the read cycle. The switching during pre-charge may be performed using a single switch for the reference cells and a single switch for the cell to be read, each switch connecting a bit line to the sensing amplifier. The switching thus may be performed using as few as two switches per sensing amplifier.

During equalizing, i.e. after a pre-charge phase, the charges of the memory cells that are created during a pre-charge phase are equalized. In this phase, the charges of the memory cells are typically no longer being pre-charged and the connectable is disconnected. So no more current flows between the supply and the ground line.

The memory arrangement may comprise a memory controller for dynamically selecting the reference cells used. The controller may further control the precharging of the memory cells, through the selection switch, as well as the operation of the sensing amplifier depending on the architecture.

It is an advantage of embodiments of the disclosed technology that a high yield can be enabled using the flexible reference selection, due to the possibility for reusing stuck-at memory elements to reprogram the reference word. The controller also may control the connecting means to the source line, the activation of the sensing amplifier, the selection of word lines, bit lines, etc.

The equalizing switches may be positioned between more than those bit lines comprising the reference cells, and the reference cells can be selected to be cells in those bit lines interconnected via equalizing switches.

Such a selection may be dynamically, e.g. using a memory controller, or may be performed during a calibration or correction procedure.

It is an advantage of embodiments of the disclosed technology that the detection of shorts and opens in the reference word can lead to the selection of a new word as reference word, which drastically improves the yield of a block of memory.

The memory arrangement may comprise reference cells in each of the bit lines, whereby each of the bit lines is interconnected by equalizing switches to another bit line.

The memory arrangement may comprise a first sub-arrangement and a second sub-arrangement, each of said sub-arrangements being connected to the sense amplifier through a multiplexer, comprising distinct word lines and comprising a same number of bit lines, wherein the reference cells are all defined/positioned in one sub-arrangement selected by a given Word line, and the selected memory element is in the other sub-arrangement.

The multiplexer may be an array of switches. The multiplexer may be an analog multiplexer. The use of distinct word lines allows a controller to select the reference cells independently from the selected cell to be read. In the present embodiment, the bit lines are not shared over the different sub-arrangements.

The memory arrangement may comprises at least a first and a second sub-arrangement, where each sub-arrangement is connected to a sense amplifier through a multiplexer and shares word lines with another sub-arrangement.

The reference elements are positioned in two bit lines, where each bit line belongs to a different sub-arrangement and wherein the reference signal is generated based on an equalized charge in the two bit lines that are positioned in the different sub-arrangements, and the selected memory element is located in each sub-array and connected to a bit line different from the reference elements.

The reference voltage typically thus is the voltage after charge redistribution by the equalizing switches.

The multiplexer may be an array of switches. The multiplexer may be an analog multiplexer. It is an advantage of embodiments of the disclosed technology that the memory arrangement using shared reference bit lines does not require a separate multiplexing cycle to share the charge between the sense-amplifier since it can be done while the word line is fired. Consequently, such an implementation results in a fast sensing process.

It is an advantage of embodiments of the disclosed technology that a large MUX size can be obtained with small BUS width, resulting in a minimum area penalty.

It is an advantage of embodiments of the disclosed technology that the implementation results in reduced power consumption, since an additional word line may not be necessary for generating the reference charge.

The memory arrangement furthermore may comprises a memory controller for detecting a stuck at 0/1 error in a memory cell, the controller further reserving the stuck at 0/1 memory cell for a reference cell purpose, or only for a reference cell purpose, and for altering the state of the non-stuck at 0/1 the reference cells so as to include the state of the memory cell comprising the stuck at 0/1 error. In this way, the functionality between a memory cell storing data and the reference cell is interchanged and the stuck at 0/1 memory cell can still be used, albeit not as memory cell but as a reference cell.

A multiplexer may be used for multiplexing memory elements along bit lines of the memory arrangement, whereby the multiplexer is arranged for selecting a bit line potential of the selected memory element and transferring a corresponding charge to the sense amplifier. The controller also typically control the multiplexer.

The multiplexing principle can be applied with a multiplexing number being 2 or higher. The multiplexing number is not a limiting factor for embodiments of the disclosed technology.

A multiplexer may be used for multiplexing memory elements along bit lines of the memory arrangement, whereby the multiplexer is arranged for selecting a bit line potential of the reference signal and transferring it to the sense amplifier.

The memory arrangement may be adapted for using an n-bit word in memory cells along a word line as reference, and wherein the system comprises a memory controller for dynamically altering the n-bit word used as reference.

The bit line potential may be transferred by a transfer switch to the sense amplifier. The transfer switches, the selection switches, the switches in the multiplexer, and/or the equalizing switches may be any of a transmission gate, a PFET or an NFET.

The disclosed technology also relates to a method for sensing a state of a two state resistance change memory element, the method comprising:
    selecting at least one set of two reference cells positioned at different bit lines, whereby one reference cell has a high resistance change state and a second reference cell has a low resistance change state, and
    equalizing, over the bit lines comprising the reference cells, so as to obtain an equalized charge that can be used as a reference, and
    selecting a memory element for which a state is to be sensed, thereby generating a sensing charge in the bit line,
    evaluating said sensing charge as function of said reference equalized charge so as to derive a state of said two state resistance change memory element.

Selecting at least two reference cells may mean activating the selection switch and charging the bit line. As described earlier and below, the reference cell may be set, during a set phase or write phase, prior to the reading phase, to a high resistance state and a second reference cell may be set during a set phase or write phase, prior to the reading phase, to a low resistance state.

Where reference is made to equalizing a charge, this refers to equalization of the charges of the reference cells created during the pre-charge action by closing the selection switch.

It is to be noticed that selecting the memory element to be sensed may be done at the same time as the first selecting, i.e. as the selecting of the at least two reference cells.

Evaluating the sensing charge in the sensing amplifier as function of the reference equalized charge may be comparing the sensed charge and the reference charge by the sensing amplifier.

In one embodiment, the method comprises equalizing a plurality of reference cells in one word line and providing the equalized charge to the sensing amplifier through a multiplexer and selecting a memory element in another word line, sensing a charge and providing the corresponding sensing charge signal through a separate multiplexer to the sensing amplifier, so that the equalized charge and the sensing charge can be compared for evaluating the sensing charge.

In one embodiment, the method comprises equalizing charge of a plurality of reference cells positioned in different sub-arrangements for generating an equalized charged, and sensing a sensing charge for a memory element in one of the sub-arrangements and comparing the sensing charge and the equalized charged in a sensing amplifier of the specific sub-arrangement.

The disclosed technology furthermore relates to the use of a memory arrangement as described above for storing and/or reading out data stored in the memory arrangement. As such, storing and/or reading out data are known by the person skilled in the art.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
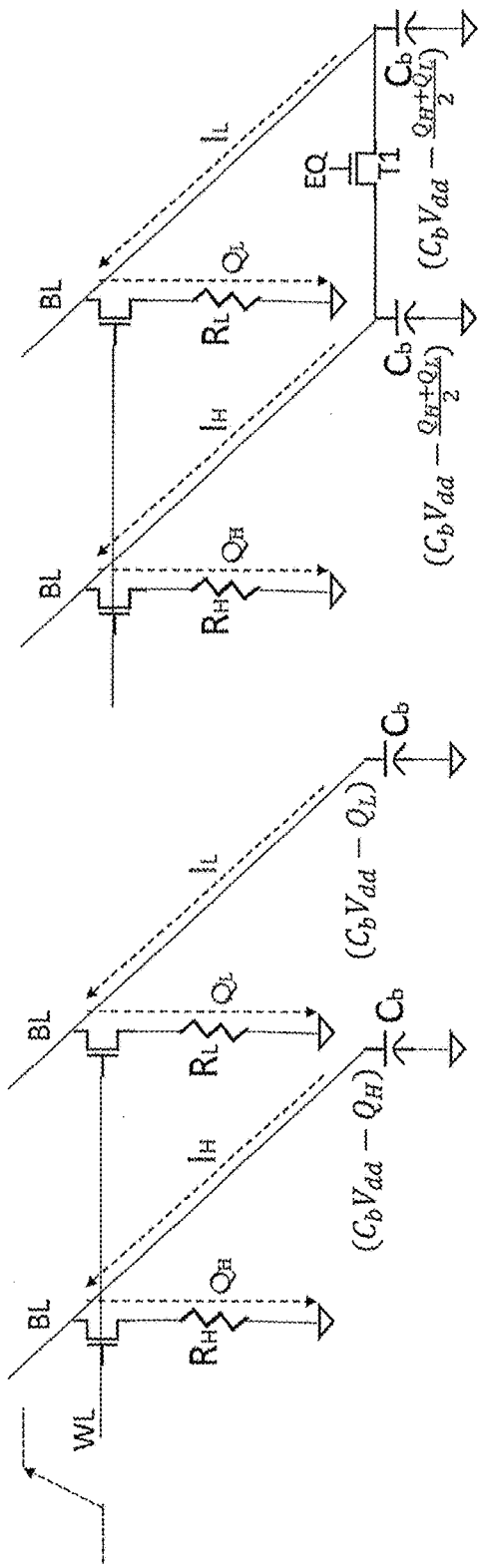
FIG. 1 illustrates the principle of charge sharing, as provided in embodiments according to the disclosed technology.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF CERTAIN ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

The memory arrangement will be shown, for ease of illustration, as a set of memory elements logically organized in rows and columns. Throughout this description, the terms "horizontal" and "vertical" (related to the terms "row" and "column" respectively) are used to provide a co-ordinate system and for ease of explanation only. They do not need to, but may, refer to an actual physical direction of the device. Furthermore, the terms "column" and "row" are used to describe sets of array elements which are linked together. The linking can be in the form of a Cartesian array of rows and columns; however, the present invention is not limited thereto. As will be understood by those skilled in the art, columns and rows can be easily interchanged and it is intended in this disclosure that these terms be interchangeable. Also, non-Cartesian arrays may be constructed and are included within the scope of the invention. Accordingly the terms "row" and "column" should be interpreted widely. To facilitate in this wide interpretation, the claims refer to logically organised in rows and columns. By this is meant that sets of . . . are linked together in a topologically linear intersecting manner; however, that the physical or topographical arrangement need not be so. For example, the rows may be circles and the columns radii of these circles and the circles and radii are described in this invention as "logically organised" rows and columns. Also, specific names of the various lines, e.g. word line and bit line, are intended to be generic names used to facilitate the explanation and to refer to a particular function and this specific choice of words is not intended to in any way limit the invention. It should be understood that all these terms are used only to facilitate a better understanding of the specific structure being described, and are in no way intended to limit the invention.

In a first aspect, the disclosed technology relates to a memory arrangement for memory cells based on two state resistance change memory elements. Such memory cells typically are arranged in an array structure and comprise crossing word lines and bit lines. For the easy of illustration, the word lines will be shown as horizontally oriented lines and the bit lines will be shown as vertically oriented lines, but as indicated above other orientations are also possible. Each memory cell is connected between a crossing word and bit line. The memory cells are also connected to a source line. Typically, the word line is connected to supply current during read-operation. In some embodiments, the bit line is pre-charged to known supply voltage of VDD before word-line is asserted. In some embodiments, the stored charge over bit-line capacitor is discharged and the current will depend on the state of the memory element ($R_H$ or $R_L$) and this current ($I_H$ or $I_L$) will flow from the bit-line to the source line. In other embodiment, another known supply voltage I used and the bit line capacitor can be further charged.

Each bit line comprises a bit line capacitance $C_b$ for storing a charge representative of the state of a selected memory element. In some embodiments, the charge on the bit line capacitance is discharged when current flows from the bit line to the source line or to ground and is influenced by the state, i.e. the resistance, of the memory element. In some embodiments, the charge on the bit line capacitance is charged when current flows from the bit line to the source line. The source line may therefore be connected to a predetermined voltage. It is to be noted that the bit line capacitance remains the same across the array for the same number of cells per column. It is to be noticed that where discharging is mentioned, this does not mean that the charge on the capacitance is fully gone, but that there will be a redistribution of the charge and there will be a residual charge left on the capacitor representative of the state of the memory element.

The memory cells comprise memory elements being two state resistance change memory element. In such elements, the resistance change is stored as a state. Typically such cells have two possible states, often referred to as a high state and a low state. In the following such states shall, where appropriate, be indicated as $R_H$ and $R_L$. It is an advantage of embodiments of the disclosed technology, that systems and devices are provided allowing to provide an accurate reference signal for evaluating whether the memory element is in a high state or in a low state. The more accurate the reference signal is, the more accurate the memory can be read.

At least two memory cells, being positioned at different bit lines, are defined, e.g. selected, as reference cells. One reference cell thereby is set in a high resistance change mode, while a second reference cell is being set in a low resistance change mode.

The reference cells correspond with memory cells that are in principle settable to any state, but for the purpose as being used as reference cells these cells are set in advance such that the average charge that will be "sensed" during the pre-charge phase is an average of the high and the low state. If for example two cells are used, typically one cell is set to a high state and one is set to a low state, so that the equalization results in an average of the high and the low state. The memory arrangement thus is put in a particular state prior to the pre-charge.

According to embodiments of the disclosed technology, at least those bit lines wherein the at least two reference cells are positioned, furthermore are interconnected using an equalizing switch for equalizing a charge on the bit line capacitors of said at least two bit lines, when the reference cells have been read out.

If $Q_H$ and $Q_L$ are the charges defined respectively by $I_H$ and $I_L$ at the capacitance $C_b$, then after charge sharing through the equalizing switch, the effective charge on each capacitance becomes "$C_{b1} \times Vdd - 0.5 \times (Q_H + Q_L)$", where Vdd is pre-charge voltage.

The resultant charge of "$C_{b1} \times Vdd - 0.5 \times (Q_H + Q_L)$" is used as reference to sense the resistance state of the memory elements in an array. According to embodiments of the disclosed technology, a reference signal thus is generated through at least two, advantageously neighbouring, reference elements, one of them being set having a high resistance $R_H$ and one of them being set as having a low resistance state $R_L$. It will be understood that while the example is given for a configuration where discharging of the capacitance is used, the same reasoning will be mutates mutandis applicable when charging of the capacitance is used.

In order to sense the state of the different other memory elements, a sensing amplifier may be used which makes use of a reference signal being equal to or based on the effective equalized charge.

The sensing amplifier is thus configured for reading the state of the selected memory element. The bit lines whereon the memory elements are positioned are connectable to the sense amplifier inputs and thus can be connected for sensing the charge for the selected memory element. Combined with the equalized charge from the reference cells, the sensing amplifier provides an output representative of the state of the selected memory element.

The equalizing switch can for example be designed by a transmission gate, a PFET or an NFET. In advantageous embodiments, the equalizing switch can be an NFET.

By way of illustration, embodiments of the disclosed technology not being limited thereto, further standard and optional features and advantages of embodiments of the disclosed technology will now further be discussed.

By way of example, the principle of charge sharing for implementing referencing is illustrated in FIG. 1. FIG. 1 illustrates part of a memory arrangement. The system illustrates two memory cells positioned on a single word line WL(1) while being connected to separate bit lines BLs at a supply voltage V. The two memory cells are selected as reference cells. The cells are set to a high resistance change state and a low resistance change state. In the bit lines a bit line capacitor $C_b$ is present wherein the charge created during pre-charged phase is stored. On the left hand side of FIG. 1, the situation is shown wherein no equalizing switch is present. For the cell in the high resistance change state, the resulting current flowing from the bit-line to source line is $I_H$ and the corresponding charge discharged from the bit line capacitor in $Q_H$, whereas for the cell in the low resistance change state, the resulting current flowing from the bit line to the source line is $I_L$ and the corresponding charge discharged from the bit line capacitor is $Q_L$. On the right hand side of FIG. 1, the situation is shown wherein, according to embodiments of the disclosed technology, an equalizing switch (EQ) is positioned between the two bit lines wherein the reference cells are positioned. This results in a charge in the bit line capacitors of "$C_{b1} \times Vdd - 0.5 \times (Q_H + Q_L)$", which is used by a sensing means, such as for example a sensing amplifier, as a reference signal.

Figure 2:
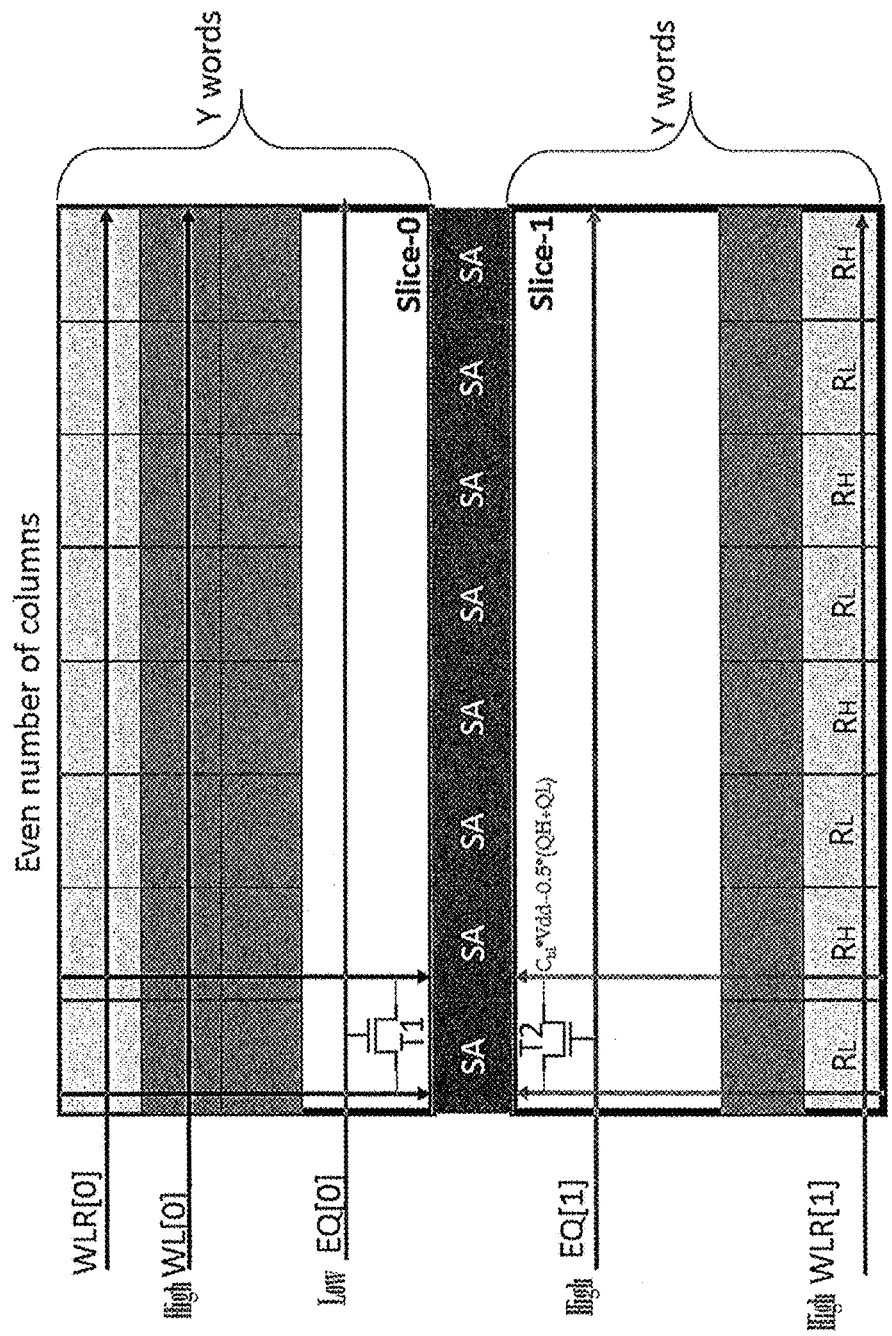
FIG. 2 illustrates a first example of an implementation of a memory arrangement according to an embodiment of the disclosed technology.

FIG. 2 illustrates an open bit-line architecture implementation according to an embodiment of the disclosed technology. The memory arrangement comprises an even number of bit lines (columns). A word line WL[0] is fired to read the word in the word line. The state of each individual memory element results in a discharge of a charge from the bit line capacitance. The word from the portion indicated by slice 0, is thus read by asserting WL[0], but in order to appropriately assess, a reference is used generated in slice 1 by asserting the equalizing signal and the reference word line RWL[1] corresponding with a word line wherein reference cells are positioned, with a predetermined memory state. The equalizing signal results in the charge sharing as illustrated in FIG. 1, such that the resulting reference signal for each of the bit lines is "$C_{b1} \times Vdd - 0.5 \times (Q_H + Q_L)$". In the example shown, it is chosen to use all memory elements as reference elements and the date in the reference word line therefore are an equal number (equal to the number of elements to be assessed in the word line of slice 0) of RH and RL state elements are used. The equalizing switch is only shown for the first and second bit line, but typically may be applied to all bit lines. In the example shown, the transistors T1 and T2 are equalizing switches implemented using NFET. If these would be implemented in PFET, then the polarity of the equalizing signal will be active-low. The equalizing signal EQ(1) is thus used to share charge across slice 1, in order to average out the effective charge deposited per bit line. The system shown in the example of FIG. 2 is symmetrical, so if any row is to be read in slice 1, the reference signal can be generated in slice 0. It is to be noticed that the invention is not limited thereto and that also an asymmetric arrangement can be used, whereby there are only memory elements that are not reference elements in one of the slices and whereby the other slice is purely used as reference signal generating element. It is to be noticed that according to embodiments of the disclosed technology, any row in the array can be used as reference word line RWL. The memory arrangement may for example comprise a memory controller for assigning a reference row dynamically during the life of the memory.

Figure 3:
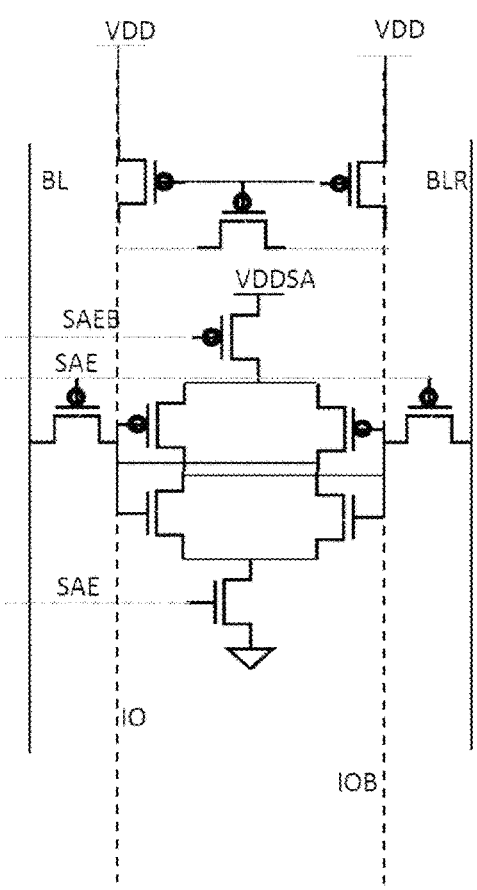
FIG. 3 shows an exemplary sensing amplifier as can be used in embodiments of the disclosed technology.

In embodiments of the disclosed technology, analysis of the content of a memory cell is performed in a sensing means, e.g. a sensing amplifier. For the sake of completeness, one example of a sensing amplifier is shown in FIG. 3. However, it will be appreciated that other suitable sensing means that can allow evaluation of a signal as function of a reference signal may be used.

Still referring to FIG. 2, the charge averaging principle applied to a 32 bit arrangement will be discussed below. If for example there are 32 bits in a word for an open-bit-line architecture as shown in FIG. 2, the situation can be as follows: If all reference cell states exactly match then the effective charge on a 32 bit-line can be calculates as "$32 \times [C_{b1} \times Vdd - 0.5 \times (Q_H + Q_L)]$", which results in a charge per bit-line as "$32 \times [C_{b1} \times Vdd - 0.5 \times (Q_H + Q_L)]/32$". Note that in this case the averaging is done over all bit lines, so according to embodiments the charge is equalized over at least two cells, but may be equalized over more than two cells. Advantageously this may be done in couples of cells in a high and a low resistance state, but it could alternatively even be done for reference cells whereby a different number of reference cells with a high resistance state compared to a low resistance state is used, provided the equalizing compensates for such different numbers. Further to the 32 bit-line example, if there is a mismatch in one of the reference cells, for example if one of the reference cell resistances has changed from RH to (RH+ΔRH), this results in charge change written as (QH−ΔQH). Upon equalization total charge on 32 bit-lines $$Q\text{total} = 32 \times C_{b1} Vdd - (15 \times QH + QH - \Delta QH + 16 \times QL)$$

$$Q\text{total} = 32 \times C_{b1} Vdd - (16 \times QH - \Delta QH + 16 \times QL)$$

This result in average charge change per cell as $C_{b1}Vdd - [0.5 \times (QH+QL) - \Delta QH/32]$. The effective error in charge per bit-line will be ±ΔQHL/N where N is number of reference cells in a ROW and ±ΔQHL represents difference in charge deposited due to change in a state resistance of individual reference cell. The error thus is reduced by a factor equal to the number of reference cells used.

It is an advantage of embodiments of the disclosed technology that the memory arrangement follows a simple design and does not use analog referencing designs. This avoids the need for input output transistors and higher supplies. Moreover the referencing system/method is simplified. Since the references are averaged, the accuracy is increased. It is to be noted that at pitch sense—amplifiers without multiplexing are possible, comparable to the situation with DRAM. The specific arrangement requires double access power, which is not the case for some embodiments described below.

Figure 4:
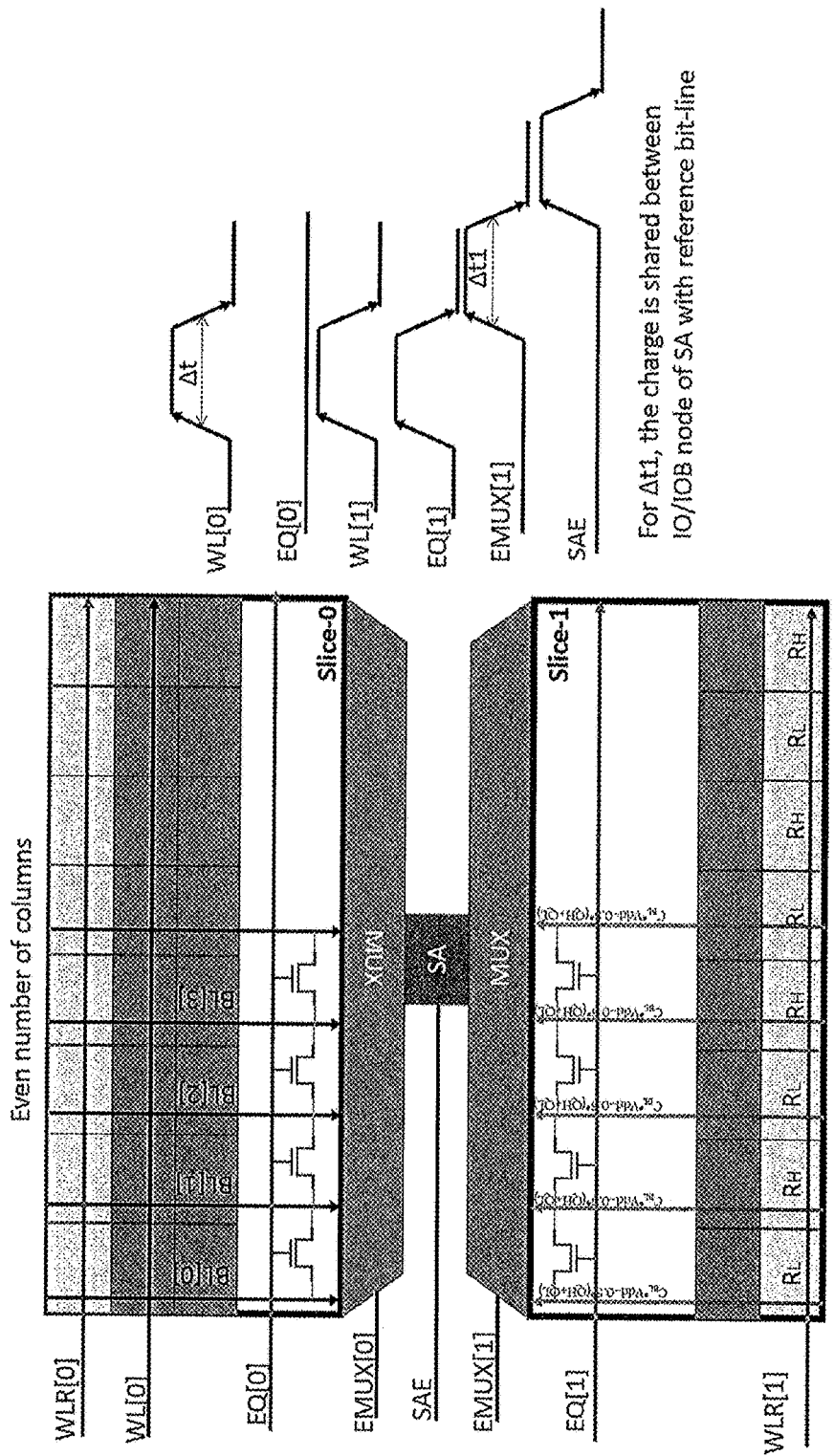
FIG. 4 illustrates a second example of an implementation of a memory arrangement according to an embodiment of the disclosed technology.

In FIG. 4 one example of an implementation is shown wherein multiplexing is used. The latter is advantageous since it allows for usage of a single sensing means for the different bit lines to be read out. The memory arrangement shown is similar to the arrangement shown in FIG. 2, except in that the different sensing amplifiers are replaced by a single sensing amplifier that is connected to the different bit lines of the memory cells to be read out and the reference memory cells by multiplexers. The implementation shown requires that there are two multiplexers.

In the arrangement shown in FIG. 4, for a time Δt time all bit-lines in slice-1 are dis-charged and equalized, thus generating a reference signal. Before enabling the multiplexer, all equalizers are switched off along with the word-line to isolate respective charge per reference bit-line. The reference charge is shared with a sensing means, e.g. with the sense-amplifier internal nodes IO/IOB illustrated in FIG. 3, by enabling EMUX[1], which ensures true sensing of single bit-line. The corresponding signals for the different lines are also shown in FIG. 4. In the upper slide, the source line, and the word line WL[0] are driven for selecting the cell to be sensed during a time Δt. The equalizing signal EQ[0] in slice 0 is not applied, since no reference signals are to be measured in slice 0 (the reference measurements are made in slice 1). In slice 1, the reference word line WL[1], also referred to as WLR[1], and the equalizing signal is driven during a time Δt so as to share charge over the reference elements. Thereafter, during a time Δt1, the charge is shared between the nodes of the sensing means and the reference bit line, so as to provide the sensing means with an appropriate reference signal. Following thereon, the sensing means senses the state of the memory element of interest in slice 0.

Figure 5:
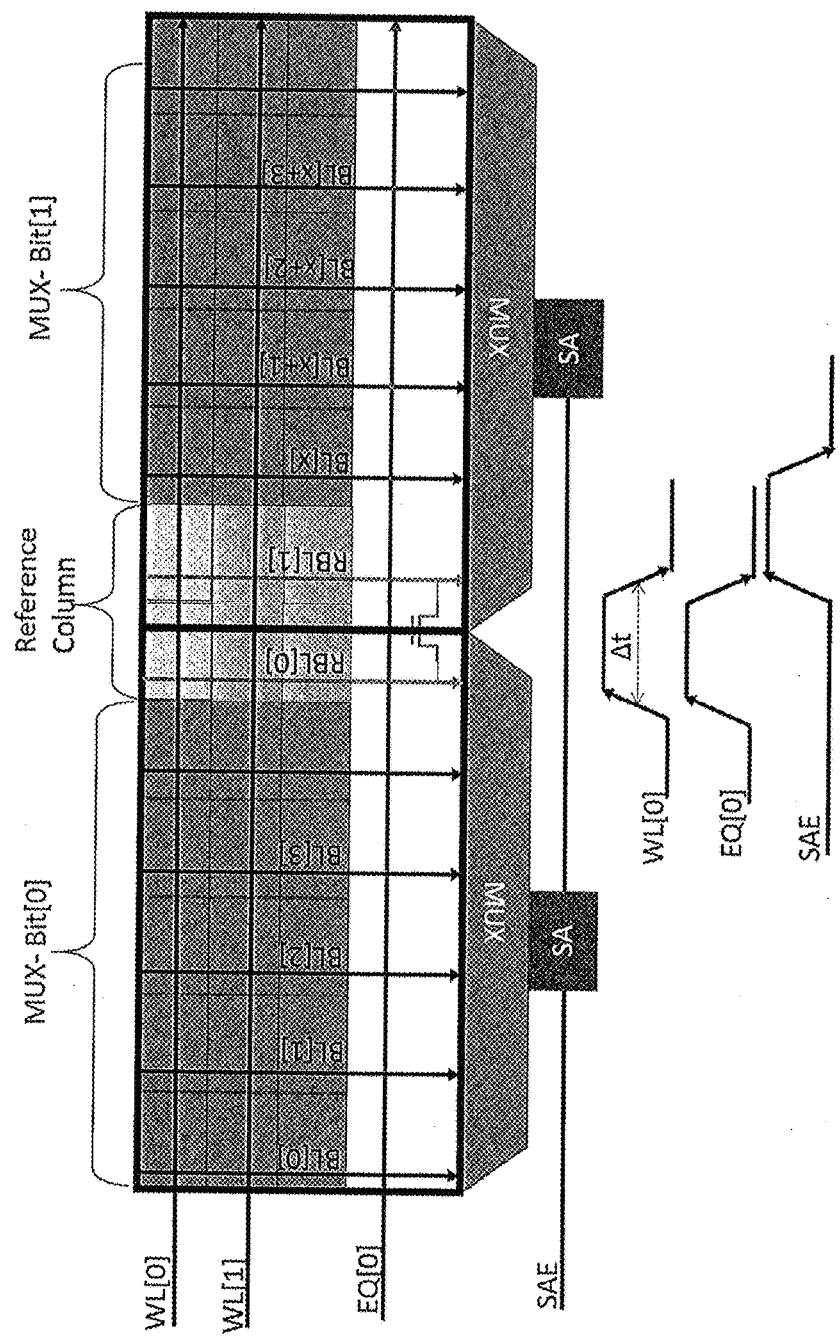
FIG. 5 illustrates a third example of an implementation of a memory arrangement according to an embodiment of the disclosed technology.

In an alternative embodiment, a closed bit line multiplexing implementation is described. An example thereof is shown in FIG. 5. The memory arrangement is adapted for sensing, whereby two sub-arrangements of memory elements are provided arranged such that each sub-arrangement has different bit lines, but that these share the word lines. Each sub-arrangement has a separate multiplexer and in each of these sub arrangements memory elements to be sensed and reference memory elements are present. In the embodiment shown, the reference is generated out of two reference column cells for sensing two bits. Each of the reference column (bit line wherein the reference element is positioned), belongs to a different sub-arrangement, but the reference columns share charge using an equalizing switch. In the present embodiment, effective power is reduced since the reference word line RWL may not be required to generate the reference charge (the reference elements are positioned on the word line where also memory cells to be measured are positioned. The two reference bit lines RBL[0] and RBL[1] are the reference bit-lines used for generating a reference per multiplexer, The averaging of charge can be achieved by adding equalizer transistors between the two reference bit-lines RBL (or if more reference bit lines are used between all reference bit-lines RBL). In operation, the word line is fired for a period in time resulting in charge generation, both for memory cells to be read as for reference cells. At the same time the equalizing switch is operated so that charge sharing occurs for the bit lines of the reference cells. Thereafter, the sensing means is initiated, allowing sensing of the memory cells to be evaluated as function of the reference signal. Since no separate cycle may be required for sharing the charge in the reference cells because it can be done while the word line is fired, this results in a fast system, compared to the system shown in FIG. 4.

Figure 6:
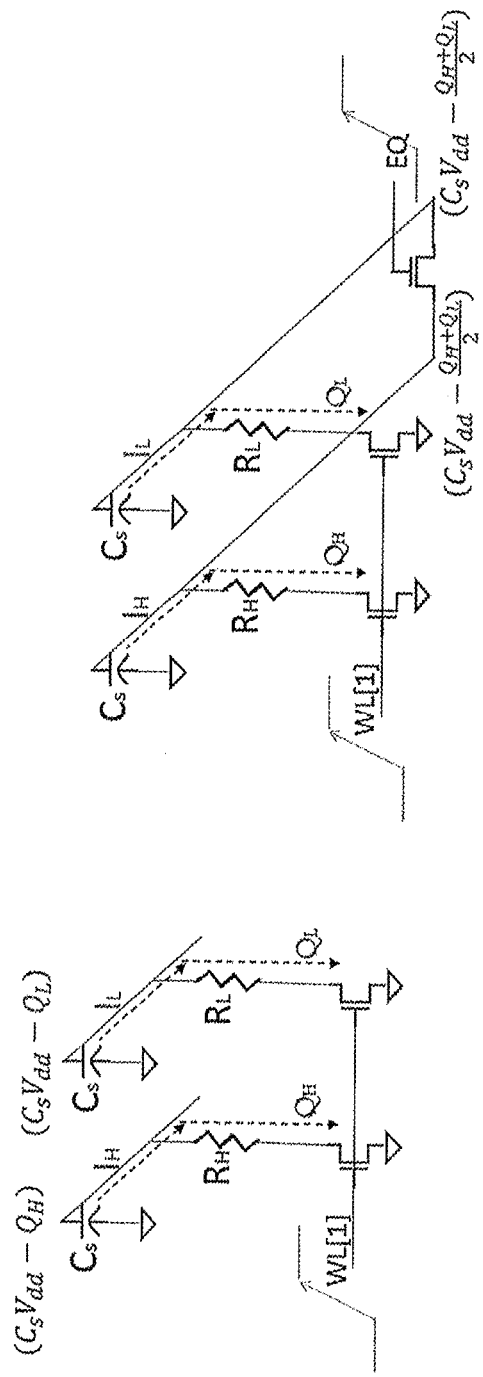
FIG. 6 and FIG. 7 illustrate other examples of charge sharing as can be used in embodiments of the disclosed technology.

Further by way of illustration, an alternative (compared to FIG. 1) memory arrangement is shown in FIG. 6, wherein precharging via the source line is performed. The latter is obtained by implementing a voltage per bit line instead of applying a sensing current. Precharging can be performed using a voltage Vdd, resulting in an additional charge Cs*Vdd being present on the capacitor. It is to be noticed that the initial charge may correspond with the initial charge Cs*Vdd to maximize the range to Vdd or Vss, but can be different. The resulting charge then is a combination of the source line discharge from VDD and the charge induced by the resistance of the reference elements, resulting in $$\left(C_s V_{dd} - \frac{Q_H + Q_L}{2}\right)$$

Figure 7:
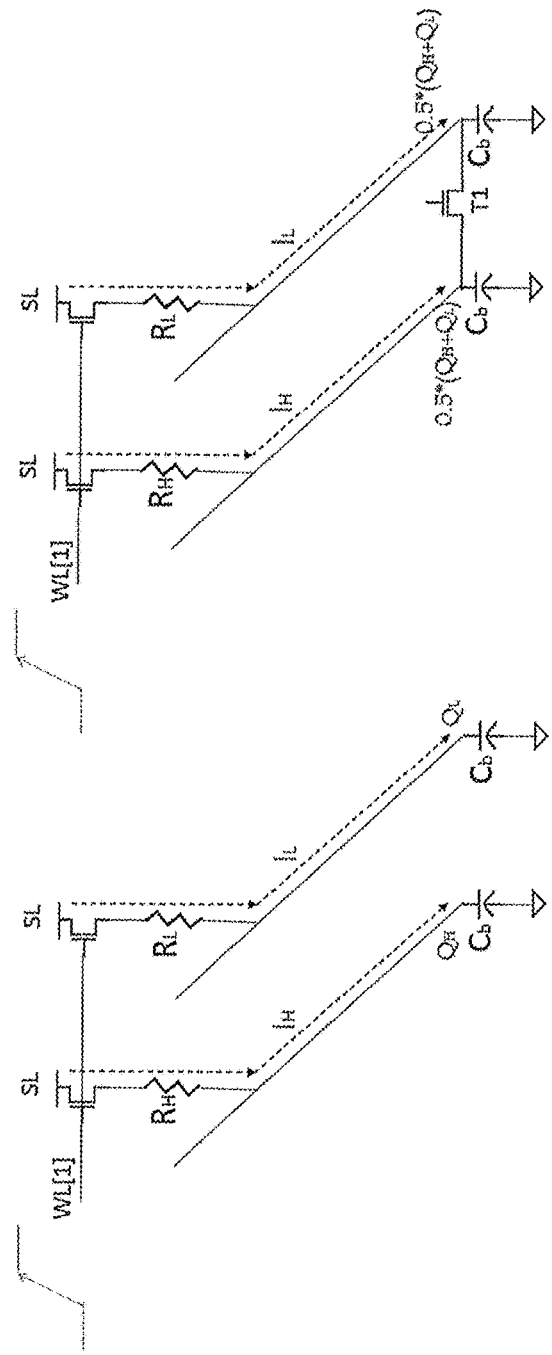

In yet another arrangement, as shown in FIG. 7, a charging of the bitline from source line is performed. The resulting charge then is the charge deposited by the resistance of the reference elements, resulting in $$\frac{Q_H + Q_L}{2}.$$

By way of illustration, embodiments of the disclosed technology not being limited thereto, the averaging effect of the equalizer has been studied in some more detail.

In the study, a same number of RH and RL state STT-MRAM cells was used in the reference memory elements. It was seen that a 14% reduction in RH sensing spread was obtained and a 17% reduction in RL sensing spread when 4 pairs are averaged in comparison with 1 pair. Averaging all reference cells improves the spread of the reference and in effect improves the yield. It was also noted that the reference generation according to embodiments of the disclosed technology averages out local variations.

In a second aspect, the disclosed technology relates to a method for sensing a state of a two state resistance change memory element. The method may be advantageously implemented for a memory arrangement as described above. The method comprises selecting at least two reference cells positioned at different bit lines, whereby one reference cell has a high resistance change state and a second reference cell has a low resistance change state, and equalizing, over the bit lines, a charge caused by the selection of said two reference cells so as to obtain an equalized charge that can be used as a reference. The method also comprises selecting a memory element for which a state is to be sensed, thereby generating a sensing charge in the bit line and evaluating said sensing charge as function of said reference equalized charge so as to derive a state of said tow state resistance change memory element. The selection of at least two reference cells may be a selection of previously determined reference cells but also may encompass dynamical selection of reference cells (or even a reference word). Such dynamic selection may be such that it corresponds with positioning a reference cell at a position of a memory element having a stuck at 0/1 error. Further features and advantages may correspond with the functionality of the components as described in the first aspect.

According to some embodiments of the disclosed technology, the above described system and method also may be used for optimizing the yield of a memory arrangement. At present, often redundancy is used to guarantee a sufficient yield. The ideas described above could nevertheless be used to cope with stuck at 0/1 faults in memory elements. More particularly, by dynamically altering the reference cells used in the memory arrangement towards memory cells where a stuck at 0/1 fault occurs, the previously used reference cells could be used for storage and the memory cells comprising the faults could be used as a reference cell, since for reference cells a fixed resistance value may be required. In other words, memory cells with a stuck at 0/1 fault can be reused and the failure can be rectified. The memory arrangement may have a memory controller programmed for altering one or more reference memory elements.

Figure 8:
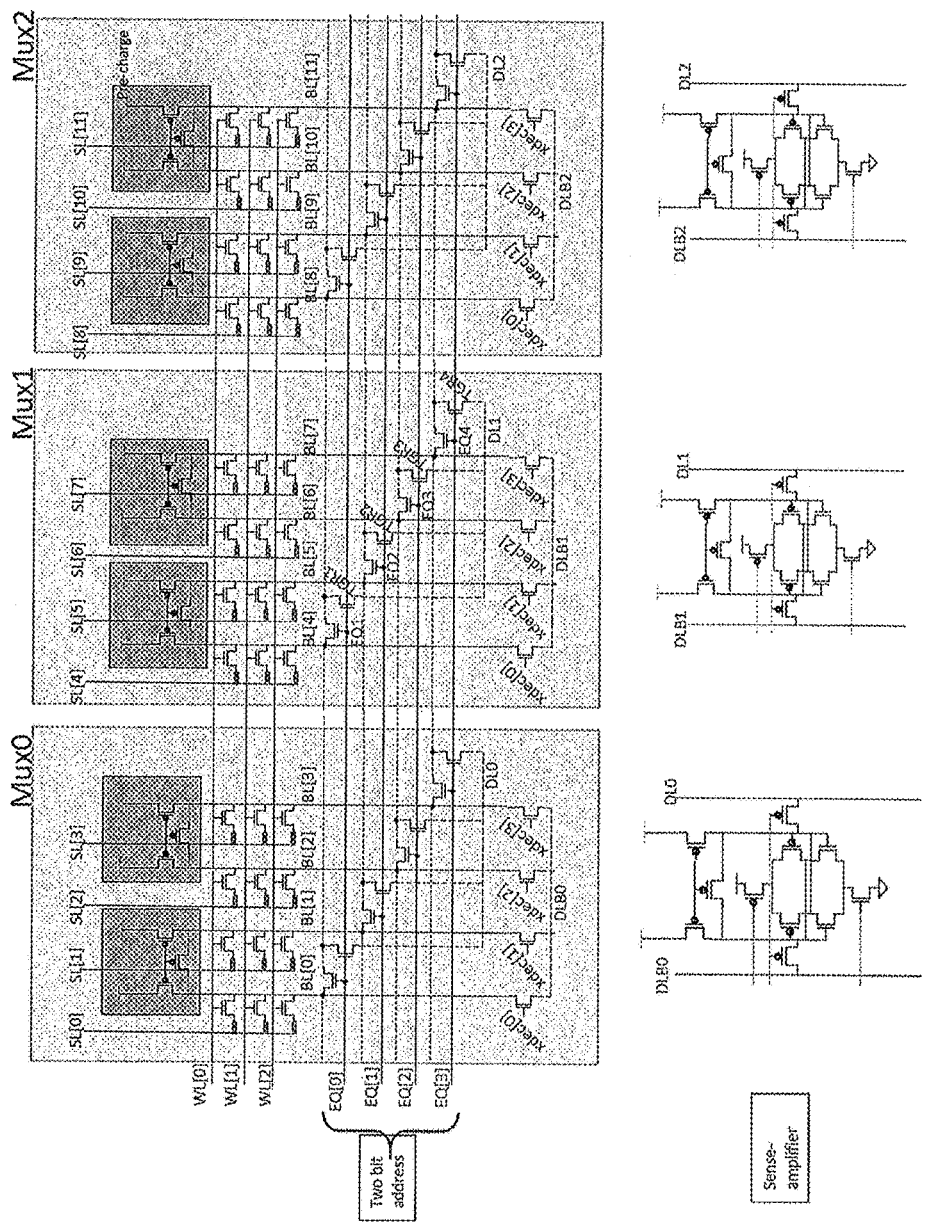
FIG. 8 illustrates the principle of using a variable reference word in a row, where any word can be used for generating the reference.

The principle is described with reference to FIG. 8, illustrating a memory arrangement wherein a Mux-4 multiplexer is used for multiplexing Bit-lines B[0,11]. The multiplexer allows to select one bit line potential and transfers it on the data line or reference data line based on the multiplexing. For example, suppose that the 4th word in a word line (ROW) is used for generating a reference for other words in a ROW by using the charge sharing concept as described above. The equalizer transistor then is set to equalize charges on BL[3], BL[7], BL[11] and BL[15] for a 4 bit word in a memory array. For the selected word line (ROW), the equalizer transistor EQ[3] signal equalizes and generates the reference and then transfers the equalized charge on a reference data line through the TGR4 (transmission gate/nmos/pmos) selector. The reference data line DL1 is a sense node of an amplifier. The xdec[0:3] signals are used to select the TG* transmission gates to transfer charges from BL to DLB1 node of an amplifier. As the 4th word is used for referencing, xdec[3] selects the reference signal which will result into invalid read for memory. Similarly, any word in a ROW can be used for reference where word used for reference can be changed by asserting EQ[*] signal. During the life span of the memory, if suppose memory stuck at high or low resistance state in a ROW then memory controller goes into debug mode to detect a failed location of memory element by regenerating reference from other words and generating a reference from word consisting of stuck at memory element by updating data into it.

Figure 9:
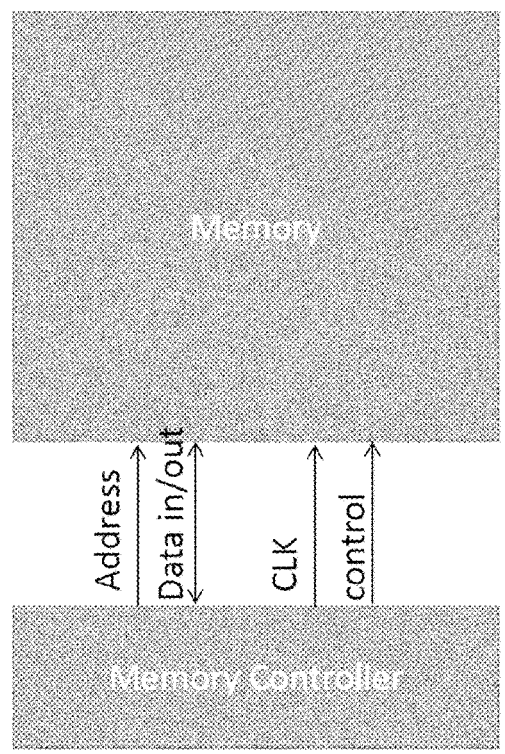
FIG. 9 illustrates a memory controller and a memory handshake.

A schematic representation of a memory controller is shown in FIG. 9. It indicates the memory controller as well as the memory elements, referred to as memory. Furthermore it indicates typical signal exchange performed by the controller. The controller may send address data, CLK data and control data to the memory, as well as interchange other data in/out with the memory. The controller may operate based on a predetermined algorithm, a neural network, etc. The controller may be programmed for, if a read failure is encountered for a word, entering into a debug mode to detect the failure. Upon detection of the failure, in some embodiments the controller may decide to set or reset reference memory elements, e.g. a reference word used in a row (on a Word Line). Communication between the memory and the memory controller may be performed using a handshake. Such a handshake between the memory and the memory controller may be as indicated in FIG. 9, illustrating the type of data that is sent or interchanged. The memory controller may act as a master that decides or sets reference memory elements, such as reference words, for a row.

Figure 10:
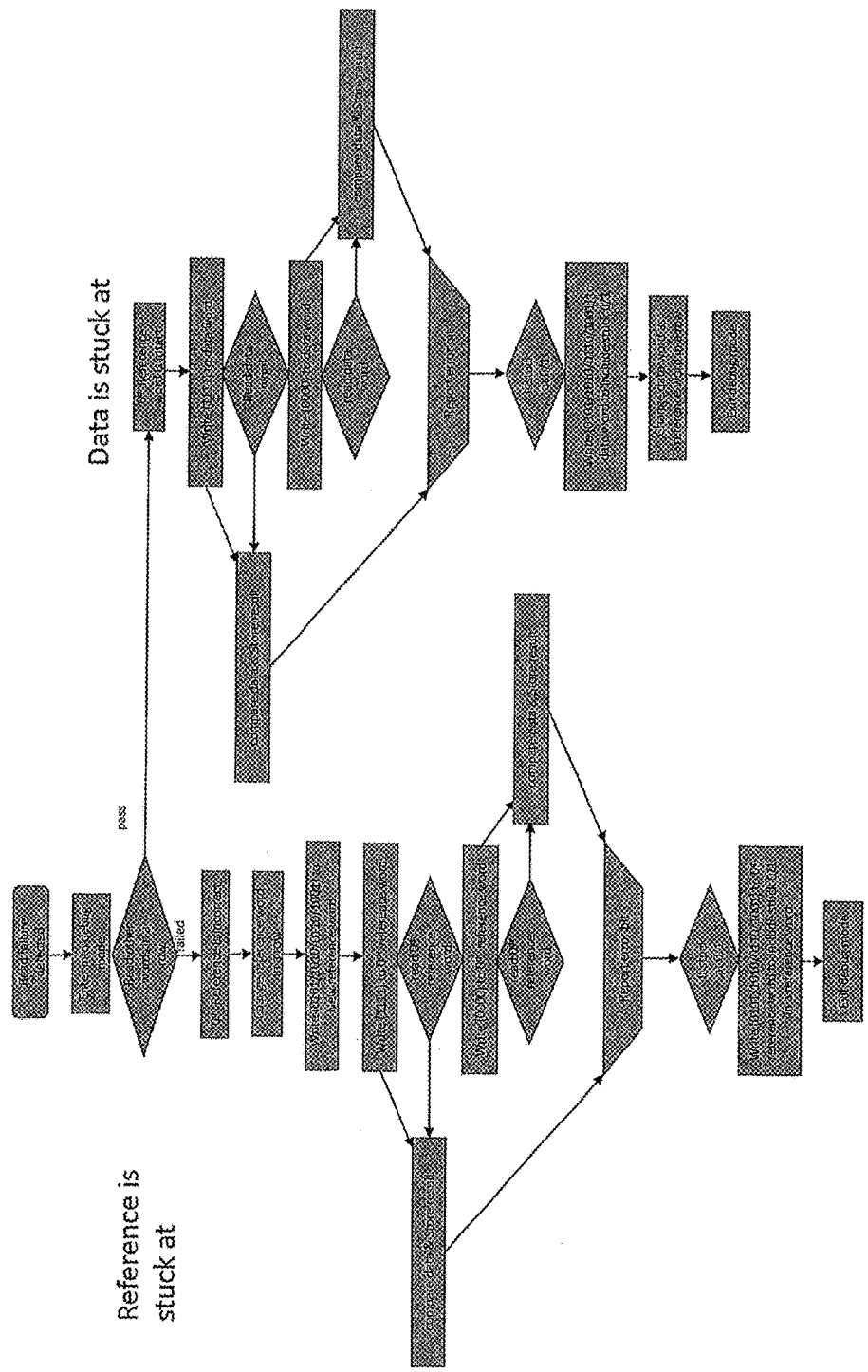
FIG. 10 illustrates stuck at fault detection in data and rectification by reusing a stuck at element as a part of a reference word.
Figure 11:
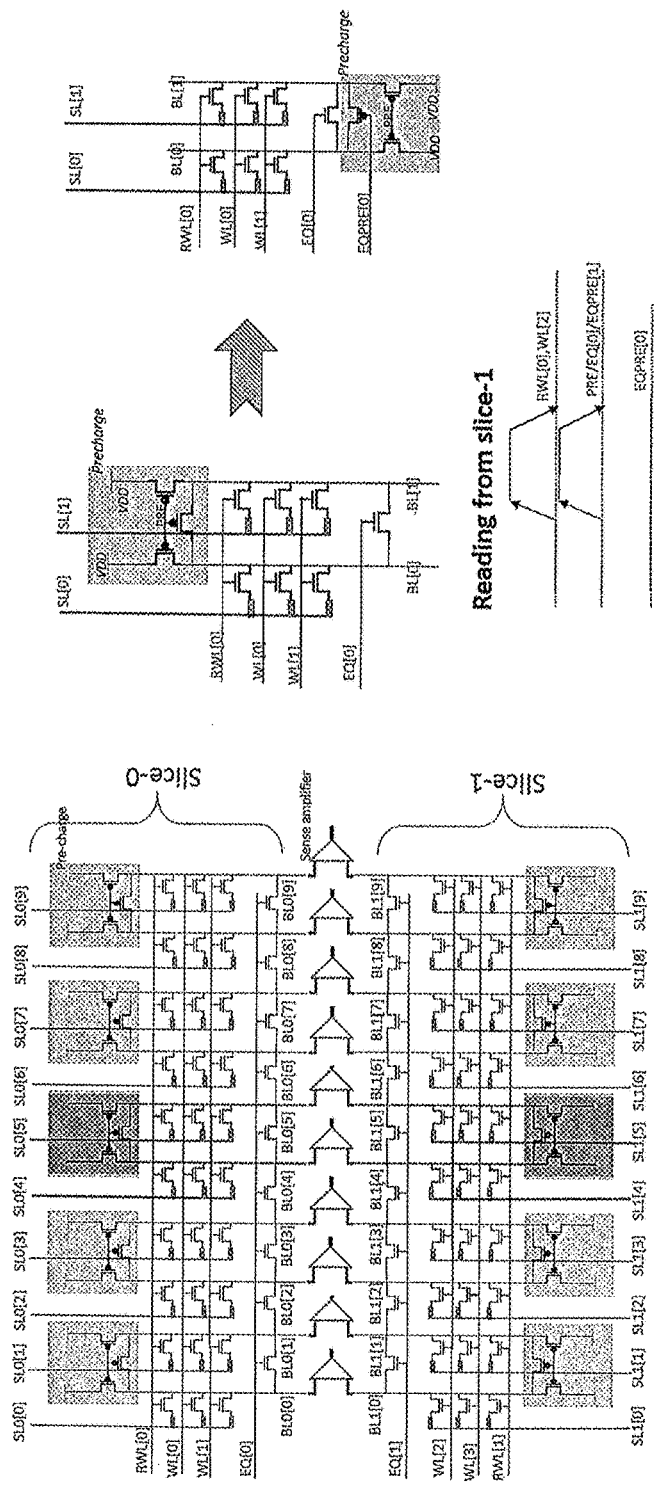
FIG. 11 illustrates reuse of pre-charge equalizer during read operation.

By way of illustration, embodiments of the disclosed technology not being limited thereto, an example of an algorithm used in detecting failure in the data of a row or reference row is shown in FIG. 10.

In a first step, a read failure is detected by the microcontroller. This triggers the microcontroller to go into debug mode.

If the memory controller is able to read other words in the row, it is decided that the reference word is intact. Then (1111) and (0000) data is written to the data word and read. The data is compared and the result is stored. Based on the information obtained an error bit is reported. If the error is a stuck at 0/1 error, the algorithm proceeds by writing (0101/1010/0110/1001) to the data word to include the stuck at 0/1 error. The data word is then changed as reference word in the row. The memory controller thereafter exits the debug mode.

If upon entry into the debug mode, the other words in the word row cannot be read, the $0^{th}$ reference is incorrect and the reference word in the row is changed. The data (0101/1010/0110/1001) is written to the new $0^{th}$ reference word. Then (1111) and (0000) data is written to the reference word and read. The data is compared and the result is stored. Based on the information obtained an error bit is reported. If the error is a stuck at 0/1 error, the algorithm proceeds by writing (0101/1010/0110/1001) to the reference word to include the stuck at 0/1 error. Thereafter, the system exits the debug mode.

It is to be noted that the same concept can be used to detect short and open circuit. For example, if one of the memory elements is shortened, this will increase a charge over the sense node more than is either charge deposited by the high resistance change state or low resistance change state. This will result in all 0 or 1 states as read output. In other words, shortened memory elements can be detected. Similarly, an open circuit will result in no charge being deposited over the sense node, resulting in a lower charge than RH or RL state element and thus will result in all 1 or 0 as read out based on the design.

In yet a further aspect, the disclosed technology relates to a memory controller for controlling a memory according to a method as described in the second aspect. The memory controller may be implemented in software as well as in hardware. The above described method embodiments as well as the memory controller may be implemented as software in a processor. One configuration of such a processor may for example include at least one programmable computing component coupled to a memory subsystem that includes at least one form of memory, e.g., RAM, ROM, and so forth. It is to be noted that the computing component or computing components may be a general purpose, or a special purpose computing component, and may be for inclusion in a device, e.g., a chip that has other components that perform other functions. Thus, one or more aspects of the disclosed technology can be implemented in digital electronic circuitry, or in computer hardware, firmware, software, or in combinations of them. For example, each of the method steps of the method for controlling the memory may be a computer implemented step implemented as one or a set of instructions. Thus, while a processor as such is prior art, a system that includes the instructions for controlling the memory is not prior art.

The disclosed technology thus also includes a computer program product which provides the functionality of any of the methods according to the disclosed technology when executed on a computing device. Vice versa, the computer program products described above may be implemented as hardware in computing devices. Alternatively, the computer program products may be implemented as computer-implemented methods and the disclosed technology therefore also relates to the corresponding computer-implemented methods.

In another aspect, the disclosed technology relates to a data carrier for carrying a computer program product as described above. Such a data carrier may comprise a computer program product tangibly embodied thereon and may carry machine-readable code for execution by a programmable processor. The disclosed technology thus relates to a carrier medium carrying a computer program product that, when executed on computing means, provides instructions for executing any of the methods as described above. The term "carrier medium" refers to any medium that participates in providing instructions to a processor for execution. Such a medium may take many forms, including but not limited to, non-volatile media, and transmission media. Non-volatile media includes, for example, optical or magnetic disks, such as a storage device which is part of mass storage. Common forms of computer readable media include, a CD-ROM, a DVD, a flexible disk or floppy disk, a tape, a memory chip or cartridge or any other medium from which a computer can read. Various forms of computer readable media may be involved in carrying one or more sequences of one or more instructions to a processor for execution. The computer program product can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fibre optics, including the wires that comprise a bus within a computer.

It is to be understood that although preferred embodiments, specific constructions and configurations, as well as materials, have been discussed herein for devices according to the present invention, various changes or modifications in form and detail may be made without departing from the scope and spirit of this invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. A memory device comprising:
   a plurality of memory cells arranged in an array, wherein each memory cell comprises a memory element configured to be switched between at least two resistance states; and
   a plurality of word lines and a plurality of bit lines crossing each other, wherein each of the memory cells is formed at a crossing between one of the word lines and one of the bit lines,
   wherein the memory cells are configured to be connected to a source line,
   wherein each bit line has a bit line capacitance and is configured to store a charge associated with a state of a selected memory element,
   wherein at least two memory cells electrically connected between one of the word lines and at least two different bit lines are configured as reference cells, wherein one of the reference cells is in a high resistance state and the other of the reference cells is in a low resistance state, and
   wherein the at least two different bit lines electrically connected to the reference cells are interconnected by an equalizing switch configured to equalize charges associated with bit line capacitances of the at least two bit lines; and a memory controller configured to select any of the word lines as a reference word line, such that different ones of the word lines can be used as reference word lines at different times.

2. The memory device according to claim 1, wherein the charge associated with the state of the selected memory element is a charge when current is flowing through the selected memory element.

3. The memory device according to claim 1, further comprising a sense amplifier for reading the state of the selected memory element that is different from the low and high resistance states of the reference cells, wherein the sense amplifier is configured to use an equalized charge associated with the bit line capacitances as a reference signal and is further configured to use the charge associated with the selected memory element for reading the state of the selected memory element.

4. The memory device according to claim 1, wherein the equalizing switch comprises a field effect transistor (FET), and/or wherein the memory elements are spin transfer torque magnetic random access memory (STT-MRAM) elements or resistive random access memory (RRAM) elements.

5. The memory device according to claim 1, wherein the memory elements are connected to the source line through a selection switch configured to selectively electrically connect the memory elements with a supply line during a pre-charge phase.

6. The memory device according to claim 1, wherein the memory controller is configured to dynamically select one of the reference cells.

7. The memory device according to claim 1, wherein the equalizing switch is positioned at least between the bit lines electrically connected to the reference cells, and wherein the reference cells are configured to be selected to be the reference cells electrically connected to the bit lines interconnected via equalizing switches.

8. The memory device according to claim 1, wherein the memory device comprises the reference cells electrically connected to each of the bit lines, and wherein each one of the bit lines is interconnected by an equalizing switch to another one of the bit lines.

9. The memory device according to claim 1, wherein the memory device comprises a first sub-arrangement and a second sub-arrangement, wherein each of the first and second sub-arrangements:

is electrically connected to the sense amplifier through a multiplexer, comprises distinct word lines, and comprises the same number of bit lines, wherein the reference cells are positioned in a first sub-arrangement selected by a given word line, while the selected memory element is in the second sub-arrangement.

10. The memory device according to claim 1, wherein the memory device comprises at least a first sub-arrangement and a second sub-arrangement, wherein each of the at least first and second sub-arrangements:

is electrically connected to a sense amplifier through a multiplexer, and shares word lines with another one of the at least first and second sub-arrangements, wherein the reference cells are positioned in two bit lines, wherein each of the two bit lines belong to a different sub-arrangement, and wherein the reference cells are configured to generate a reference signal based on an equalized charge in the two bit lines that are positioned in different sub-arrangements, and a selected memory element is located in each sub-arrangement and connected to a bit line different from the at least two different bitlines electrically connecting the reference cells.

11. The memory device according to claim 1, wherein the memory controller is configured to detect a memory cell having an error state that is stuck at a logical 1 or a logical 0, wherein the controller reserves the memory cell having the error state for reference purposes and for altering the state of a reference memory cell that is not stuck at a logical 1 or a logical 0 so as to include the state of the memory cell comprising the error.

12. The memory device according to claim 5, further comprising a multiplexer configured to multiplex memory elements along the bit lines, whereby the multiplexer is configured to select a bit line potential of the selected memory element and to transfer a corresponding charge to a sense amplifier, and/or whereby the multiplexer is configured to select a bit line potential of a reference signal and to transfer a corresponding charge to the sense amplifier.

13. The memory device according to claim 12, wherein the memory device is adapted for using an n-bit word in memory cells along a word line as reference, and wherein the system comprises the memory controller for dynamically altering the n-bit word used as reference, and/or wherein the bit line potential is transferred by a transfer switch to the sense amplifier, wherein the transfer switch, the selection switch, switches in the multiplexer and/or the equalizing switch include one or more of a transmission gate, a p-channel field effect transistor (PFET) or an n-channel field effect transistor (NFET).

14. A method of sensing a state of the memory element in the memory device according to claim 1, the method comprising selecting the at least two reference cells electrically connected between the one of the word lines and the at least two different bit lines, equalizing charges associated with the at least two reference cells, thereby obtaining an equalized charge that is used as a reference, selecting the memory element in the memory device whose state is to be sensed, thereby generating a sensing charge, and evaluating the sensing charge in a sensing amplifier, as a function of the equalized charge that is used as the reference, thereby deriving a signal representative of the state of the memory element.

15. The memory device of claim 1, wherein the memory device is configured to interchangeably use each of the memory cells as a storage cell or as a reference cell.

16. A memory device comprising:

a plurality of memory cells arranged in an array, wherein each memory cell comprises a memory element configured to be switched between at least two resistance states; and a plurality of word lines and a plurality of bit lines crossing each other, wherein each of the memory cells is formed at a crossing between one of the word lines and one of the bit lines, wherein the memory cells are configured to be connected to a source line, wherein each bit line has a bit line capacitance and is configured to store a charge associated with a state of a selected memory element, wherein at least two memory cells electrically connected between one of the word lines and at least two different bit lines are configured as reference cells, wherein one of the reference cells is in a high resistance state and the other of the reference cells is in a low resistance state, and wherein the at least two different bit lines electrically connected to the reference cells are interconnected by an equalizing switch configured to equalize charges associated with bit line capacitances of the at least two bit lines; and a memory controller configured to dynamically select one of the reference cells, such that different ones of the reference cells can be used as reference cells at different times.

17. The memory device of claim 16, wherein the reference cells are directly connected to a word line to which storage memory cells are also connected.

18. The memory device according to claim 16, wherein the memory device comprises a first sub-arrangement and a second sub-arrangement, wherein each of the first and second sub-arrangements:
- is electrically connected to the sense amplifier through a multiplexer,
- comprises distinct word lines, and
- comprises the same number of bit lines, wherein the reference cells are positioned in a first sub-arrangement selected by a given word line, while the selected memory element is in the second sub-arrangement.

19. The memory device according to claim 16, wherein the memory device comprises at least a first sub-arrangement and a second sub-arrangement, wherein each of the at least first and second sub-arrangements:
- is electrically connected to a sense amplifier through a multiplexer, and
- shares word lines with another one of the at least first and second sub-arrangements, wherein the reference cells are positioned in two bit lines, wherein each of the two bit lines belong to a different sub-arrangement, and wherein the reference cells are configured to generate a reference signal based on an equalized charge in the two bit lines that are positioned in different sub-arrangements, and a selected memory element is located in each sub-arrangement and connected to a bit line different from the at least two different bitlines electrically connecting the reference cells.

* * * * *

UNITED STATES PATENT AND TRADEMARK OFFICE
CERTIFICATE OF CORRECTION

PATENT NO. : 10,170,182 B2  
APPLICATION NO. : 15/458874  
DATED : January 1, 2019  
INVENTOR(S) : Sushil Sakhare Page 1 of 1

It is certified that error appears in the above-identified patent and that said Letters Patent is hereby corrected as shown below:

In the Specification

In Column 11, Line 31 (Approx.), delete "bit-line" and insert --bit line--.

In Column 11, Line 47 (Approx.), delete "bit-lines" and insert --bit lines--.

In Column 12, Line 54, delete "positioned." and insert --positioned.)--.

In Column 12, Line 56, delete "multiplexer," and insert --multiplexer.--.

In Column 13, Line 22 (Approx.), delete "bitline" and insert --bit line--.

In the Claims

In Column 18, Line 6, Claim 10, delete "bitlines" and insert --bit lines--.

In Column 20, Line 23 (Approx.), Claim 19, delete "bitlines" and insert --bit lines--.

Signed and Sealed this  
Sixteenth Day of June, 2020

Andrei Iancu  
*Director of the United States Patent and Trademark Office*